United States Patent [19]
Takatani

[11] Patent Number: 6,100,174
[45] Date of Patent: Aug. 8, 2000

[54] GAN GROUP COMPOUND SEMICONDUCTOR DEVICE AND METHOD FOR PRODUCING THE SAME

[75] Inventor: Kunihiro Takatani, Yamatotakada, Japan

[73] Assignee: Sharp Kabushiki Kaisha, Osaka, Japan

[21] Appl. No.: 09/063,875

[22] Filed: Apr. 21, 1998

[30] Foreign Application Priority Data

Apr. 25, 1997 [JP] Japan .................................... 9-108673

[51] Int. Cl.[7] .................................................. H01L 21/28
[52] U.S. Cl. .......................... 438/605; 438/602; 438/604; 257/744; 257/745
[58] Field of Search ............................... 438/45, 46, 602, 438/604, 605; 257/13, 742, 743, 744, 745

[56] References Cited

U.S. PATENT DOCUMENTS 5,563,422 10/1996 Nakamura et al. .

OTHER PUBLICATIONS

K. J. Duxstad et al., "High temperature behavior ot Pt and Pd on GaN" *J. Appl. Phys.*, vol. 81, No. 7 pp. 3134–3137, 1997.

T. Mori et al., "Schottky barriers and contact resistance on p–type GaN" *Appl. Phys. Lett.*, vol. 69, No. 23, pp. 3537–3539, 1996.

S. Nakamura et al., Japanese Laid–Open Publication No. 6–232450, Laid open on Aug. 19, 1994 and English abstracts thereof.

M. Senoo et al., Japanese Laid–Open Publication No. 8–64871, Laid open on Mar. 8, 1996 and English abstracts thereof.

H. S. Venugopalan et al., "Interfacial reactions between nickel thin films and GaN" *J. Appl. Phys.*, vol. 82, No. 2, pp. 650–654, 1997.

M. Yamada et al., Japanese Laid–Open Publication No. 6–275868, Laid open on Sep. 30, 1994 with partial English translation.

*Primary Examiner*—Charles Bowers
*Assistant Examiner*—Keith Christianson
*Attorney, Agent, or Firm*—Morrison & Foerster LLP

[57] ABSTRACT

A GaN group compound semiconductor device includes an electrode structure provided on a p-GaN group compound semiconductor layer, the electrode structure including: a first layer formed on the p-GaN group compound semiconductor layer, the first layer including a compound including a first metal element and Ga; and a second layer formed on the first layer, the second layer including the first metal element. The first layer contains substantially no nitrogen.

13 Claims, 6 Drawing Sheets

GAN GROUP COMPOUND SEMICONDUCTOR DEVICE AND METHOD FOR PRODUCING THE SAME

BACKGROUND OF THE INVENTION

1. Field of the Invention

The present invention relates to a GaN group compound semiconductor device, e.g., a semiconductor laser diode, and a method for producing the same.

2. Description of the Related Art

GaN group compound semiconductors, generally defined by the formula $In_xGa_yAl_zN$ (where $x+y+z=1$; and $0 \leq x, y, z \leq 1$), have a large energy band gap and high thermal stability, and therefore are regarded as a class of promising material systems adaptable to various applications, including light emitting devices and high-temperature devices. Among others, LEDs (light emitting diodes) composed essentially of such materials, which provide luminous intensity on the order of several candelas (cd) in wavelengths ranging from blue to green, have already been developed and applied to practical use. Future research and development activities will be directed to the achievement of a full color system (i.e., by providing illumination at still longer wavelengths) or laser diodes (LD) composed essentially of such materials.

FIG. 1 is a schematic cross-sectional view showing a conventional structure employed as a p-side electrode for the aforementioned devices. As shown in FIG. 1, the p-side electrode includes a metal layer 602 (composed essentially of Ni) formed on a p-GaN layer 601 functioning as a p-contact layer, as well as an intermediate layer 604 (composed essentially of GaN and Ni). The intermediate layer 604 is formed by performing annealing at 500° C. for 10 minutes in a nitrogen atmosphere while the Ni layer 602 is in contact with the p-GaN layer 601. Furthermore, a surface electrode layer 603 is layered on the Ni layer 602 for facilitating wire bonding and/or device mounting. A typical material employed for the surface electrode layer 603 is Au.

If the Ni layer 602 is in direct contact with the p-GaN layer 601 without the intermediate layer 604 interposed therebetween, a schottky barrier (energy barrier) Es formed on the valence band side of an interface S between the Ni layer 602 and the p-GaN layer 601 has a height as shown in the graph of FIG. 2. The schottky barrier (energy barrier) Es is reduced by the incorporation of the intermediate layer 604 as shown in the graph of FIG. 3.

However, a GaN group p-side electrode structure according to the aforementioned conventional technique has a problem in that the electrode has unstable ohmic properties as well as a relatively high contact resistivity of about $10^{-2}$ $\Omega$ $cm^2$ to about $10^{-3}$ $\Omega$ $cm^2$. The aforementioned conventional technique cannot attain a contact resistivity typically required for a p-side electrode of a semiconductor laser, i.e., about $5 \times 10^{-4}$ $\Omega$ $cm^2$ or less.

SUMMARY OF THE INVENTION

A GaN group compound semiconductor device according to the present invention includes an electrode structure provided on a p-GaN group compound semiconductor layer, the electrode structure including: a first layer formed on the p-GaN group compound semiconductor layer, the first layer including a compound including a first metal element and Ga; and a second layer formed on the first layer, the second layer including the first metal element, wherein the first layer contains substantially no nitrogen.

In one embodiment of the invention, the electrode structure has a contact resistivity of about $5 \times 10^{-4}$ $\Omega$ $cm^2$ or lower.

A method for producing a GaN group compound semiconductor device including an electrode structure provided on a p-GaN group compound semiconductor layer according to the present invention includes forming the electrode structure including the steps of: forming a first layer on the p-GaN group compound semiconductor layer, the first layer including a compound including a first metal element and Ga; and forming a second layer on the first layer, the second layer including the first metal element.

In one embodiment of the invention, at least one of the step of forming the first layer and the step of forming the second layer employs a method selected from a group including: a vacuum vapor deposition method, a chemical vapor deposition method, and a radiofrequency sputtering method.

In another embodiment of the invention, the first metal element includes at least one element of a group including Ru, Rh, Pd, Os, Ir, Pt, and Ni, or a compound including at least two elements of the group.

In still another embodiment of the invention, the first layer contains substantially no nitrogen.

Alternatively, a method for producing a GaN group compound semiconductor device including an electrode structure provided on a p-GaN group compound semiconductor layer according to the present invention includes forming the electrode structure including the steps of: forming a second layer on the p-GaN group compound semiconductor layer, the second layer including a first metal element; and performing an annealing to form a first layer between the p-GaN group compound semiconductor layer and the second layer, the first layer including a compound including the first metal element and Ga.

In one embodiment of the invention, the first metal element includes at least one element of a group including Ru, Rh, Pd, Os, Ir, and Pt.

In another embodiment of the invention, the step of performing an annealing is conducted at a temperature in a range between about 500° C. and about 900° C.

In still another embodiment of the invention, the first metal is Pd and the step of performing an annealing is conducted at a temperature in a range between about 500° C. and about 800° C.

In still another embodiment of the invention, the first metal is Pt and the step of performing an annealing is conducted at a temperature in a range between about 600° C. and about 900° C.

In still another embodiment of the invention, the first layer contains substantially no nitrogen.

Thus, the invention described herein makes possible the advantage of providing a GaN group compound semiconductor device including a p-side ohmic electrode having a low contact resistivity of about $5 \times 10^{-4}$ $\Omega$ $cm^2$ or less.

This and other advantages of the present invention will become apparent to those skilled in the art upon reading and understanding the following detailed description with reference to the accompanying figures.

DESCRIPTION OF THE PREFERRED EMBODIMENTS

First, the presumable causes for the problems inherent in the aforementioned conventional technique directed to the p-side electrode structure shown in FIG. 1 will be described.

Figure 1:
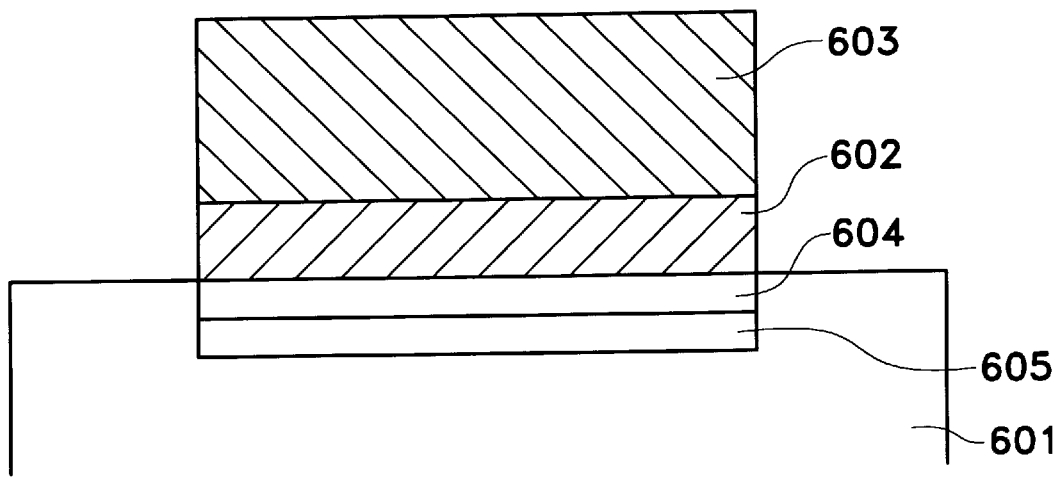
FIG. 1 is a schematic cross-sectional view showing a conventional electrode structure on a p-GaN layer.
Figure 2:
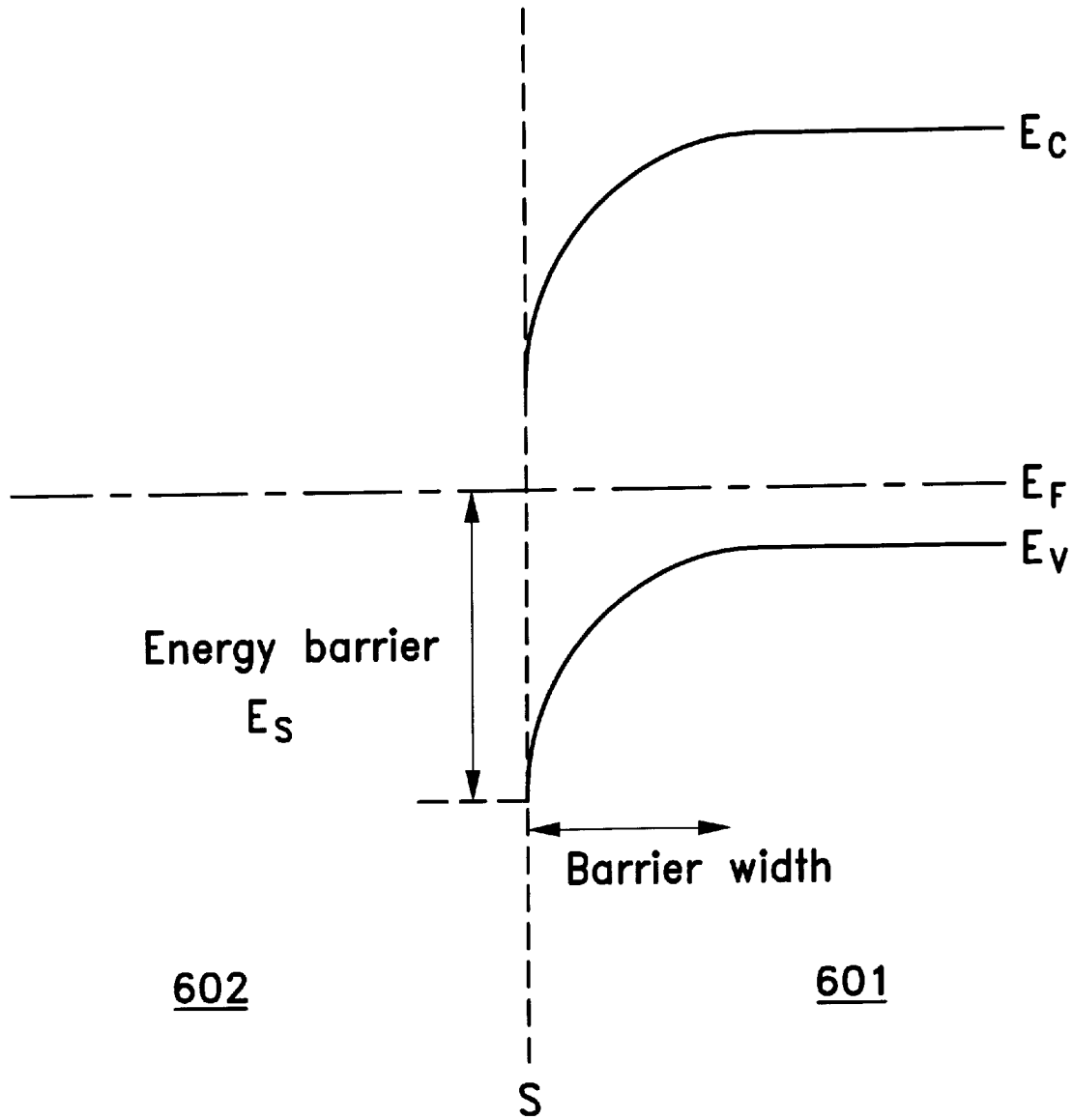
FIG. 2 is a graph schematically illustrating an energy barrier at an interface between a metal layer and a semiconductor layer in a conventional electrode structure.
Figure 3:
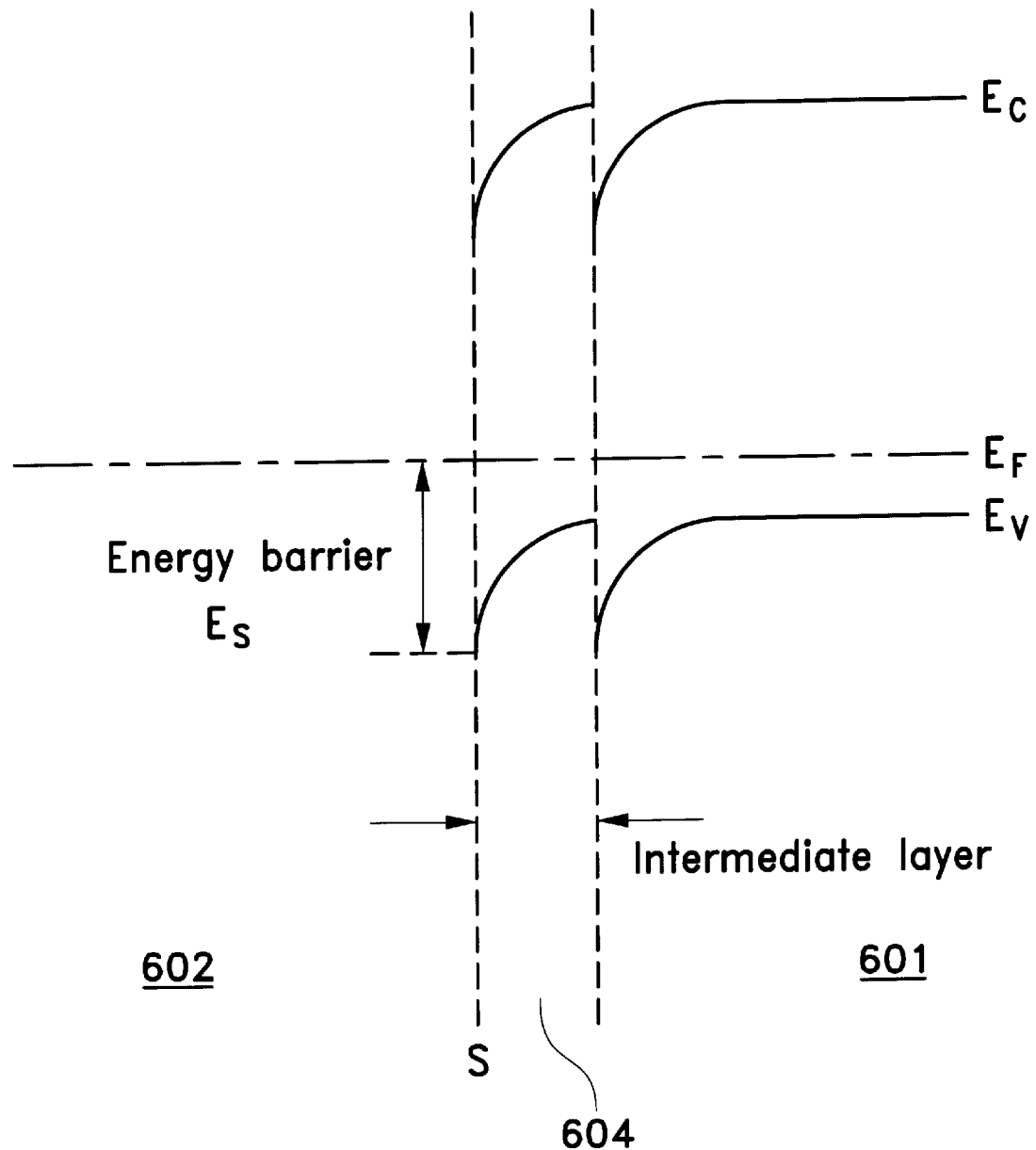
FIG. 3 is a graph schematically illustrating an energy barrier in the case where an intermediate layer is formed at the interface between a metal layer and a semiconductor layer in an electrode structure.

The inventors of the present invention have found that, as shown in FIG. 1, a further layer 605 having a high resistance is formed under the intermediate layer 604 in this conventional structure. The high-resistance layer 605 is presumably formed for the following reasons:

When the intermediate layer 604 is formed by applying a thermal treatment to the Ni metal layer 602 and the p-GaN layer 601, a large amount of compound including Ni and N is created inside the intermediate layer 604, in addition to a compound including Ga and Ni. Specifically, during an annealing process in which the Ni—Ga compound forms as the intermediate layer 604 and/or during another cycle involving a thermal process that takes place after the electrode formation (in particular in the former process), N is supplied from the underlying p-GaN layer 601, that is, the N atoms within the GaN crystal are extracted, thereby allowing the high-resistance layer (or the n-type layer) 605 to be formed on the surface of the p-GaN layer 601.

Based on the above findings, the present invention provides an electrode structure including a metal layer formed on a p-GaN group compound semiconductor and a metal-Ga compound semiconductor layer containing substantially no nitrogen (N), namely, an electrode structure including a metal layer, a metal-Ga compound semiconductor layer, and a semiconductor layer, such that a contact resistivity of about $5 \times 10^{-4}$ $\Omega$ cm$^2$ or less is achieved.

In the present specification, "containing substantially no nitrogen" means not containing nitrogen at any concentration which is equal to or higher than a concentration (about $10^{21}$ cm$^{-3}$) that would increase the contact resistivity of the electrode above a predetermined range of values. The above-mentioned concentration level of $10^{21}$ cm$^{-3}$ corresponds to about 1% of the concentration (about $10^{23}$ cm$^{-3}$) of N (or Ga) composing a GaN crystal.

The aforementioned metal-GaN compound semiconductor layer according to the present invention can be obtained by simultaneously depositing a metal (e.g., Pt) constituting the electrode as well as Ga, by using either a vacuum deposition technique, a CVD (chemical vapor deposition) technique, or an RF (radiofrequency) sputtering technique. By thus ensuring that metal atoms (e.g., Pt) and Ga atoms are simultaneously deposited directly on a GaN layer, a compound containing Ga and Pt and substantially no N can be produced with good controllability so that the molecular binding between Pt and N is minimized. Furthermore, by forming the intermediate layer in the above-described manner, it becomes possible to prevent a high-resistance region from forming at the interface between the intermediate layer and the p-GaN layer due to N atoms being extracted from the GaN layer during processes subsequent to the electrode formation. Thus, a p-side electrode can be provided so as to have a contact resistivity of about $5 \times 10^{-4}$ $\Omega$ cm$^2$ or less, based on a metal/Ga compound containing substantially no N.

As described above, when a p-GaN layer and a metal layer are in contact with each other, a very broad and high schottky barrier is normally created on the valence band side at the interface therebetween. However, by inserting a specific intermediate layer between the p-GaN layer and the metal layer, the barrier can be split in terms of both width and height so that the holes are less restrained by the barrier from passing through the interface. Thus, the ohmic properties of the electrode structure can be improved and the contact resistivity thereof can be reduced. The inventors have found that the electrode materials suitable for this purpose include Ru, Rh, Pd, Os, Ir, Pt, Ni, and the like. At least one of these metal elements, or a metal compound containing at least two of these metal elements, can be employed as a material for the electrode structure according to the present invention. The electrode structure can be composed of a single metal layer or a plurality of metal layers. However, in the case of incorporating a plurality of metal layers, it is preferable that a layer containing at least one of the aforementioned metal elements is the lowermost layer of the multiple metal layers.

In an embodiment where the metal species for the electrode are appropriately selected, it is possible to realize the electrode structure of the present invention by forming the metal layer (to function as the electrode) directly on a p-GaN group semiconductor layer and subsequently performing annealing under appropriate conditions so as to form an intermediate layer. As such an intermediate layer, a layer which is capable of minimizing the extraction of N atoms from the GaN layer and selectively forming a Ga compound with the electrode metal(s) is suitable. Examples of such metals include Ru, Rh, Pd, Os, Ir, and Pt, where Pd and Pt are more most preferable. In this case, too, an electrode structure is realized that includes a metal layer, a metal/Ga compound layer, and a GaN group semiconductor layer. Herein, a p-side electrode having a contact resistivity of about $5 \times 10^{31\ 4}$ $\Omega$ cm$^2$ or less can be achieved by employing a structure including a metal-Ga compound layer containing substantially no nitrogen, namely, a structure including a metal layer, a metal/Ga compound layer, and a GaN group semiconductor layer. In the case where Pd is employed as the electrode metal material, the annealing temperature is preferably about 500° C. to about 800° C. In the case where Pt is employed as the electrode metal material, the annealing temperature is preferably about 600° C. to about 900° C.

Hereinafter, the present invention will be described by way of specific examples, with reference to the accompanying figures.

EXAMPLE 1

Figure 4:
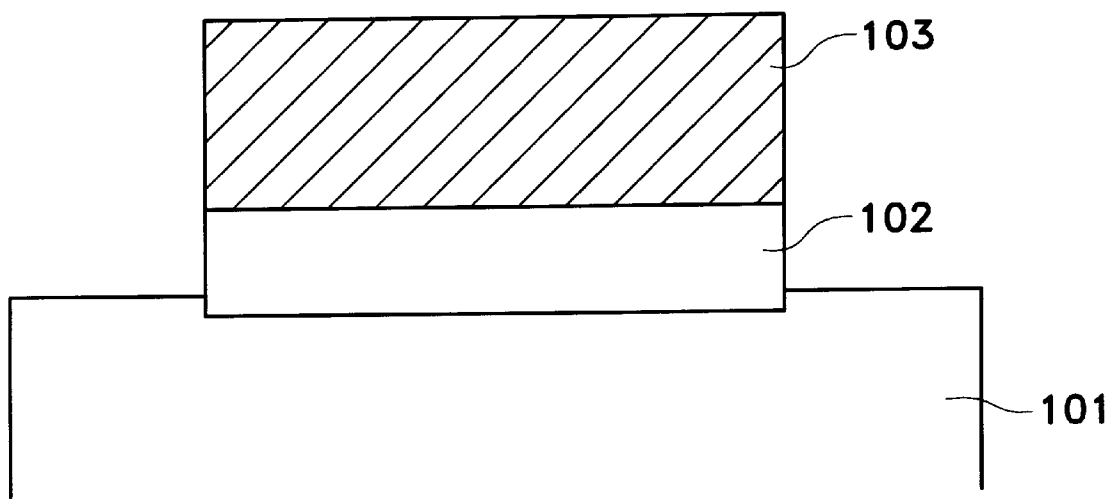
FIG. 4 is a schematic cross-sectional view showing an electrode structure according to Examples 1 and 2 of the present invention.

FIG. 4 is a cross-sectional view showing an electrode structure according to Example 1 of the present invention. The electrode structure can be formed in the following manner.

First, a p-GaN layer 101 is epitaxially grown on a sapphire substrate by an MOCVD (metalorganic chemical vapor deposition) method, with about $10^{19}$ cm$^{-3}$ of Mg added thereto for providing a carrier density of about $1.5 \times 10^{17}$ cm$^{-3}$. The surface of the p-GaN layer 101 is subjected to ultrasonic cleaning in acetone and ethanol, thereby removing the oil present thereon. Next, the sapphire substrate with the p-GaN layer 101 formed thereon is immersed in an etchant (containing HCl and deionized water mixed at a volume ration of 1:1) for about 3 minutes, thereby removing the adsorbed oxide and oxide layer formed on the surface. Then, the substrate is immersed in an etchant (containing HF and deionized water mixed at a volume ration of 1:1) for about 3 minutes, thereby removing impurities (including carbon) adhering on the surface.

After cleansing the surface of the p-GaN layer 101 as described above, the wafer is set in a main chamber of a vacuum chemical vapor deposition apparatus, and the air within the chamber is expelled to achieve a high vacuum level (about $1-2 \times 10^{-6}$ Torr or less). Herein, a deposition apparatus which allows concurrent use of a vapor deposition method (of a resistance-heating type) and an EB (electron beam) vapor deposition method is preferably employed. After a predetermined vacuum level is achieved, the wafer is heated to a temperature of about 400° C., and Ga (by a vapor deposition method of a resistance-heating type) and Pt (by an EB vapor deposition method) are simultaneously deposited on the surface of the p-GaN layer 101.

The Ga and Pt which have been ejected from the evaporation sources within the deposition apparatus both have large thermal energy, so that they experience a chemical reaction at the surface of the p-GaN layer 101, whereby a compound layer 102 formed of Ga and Pt is obtained.

Next, an electrode metal layer 103 of Pt is formed on the compound layer 102 by EB vapor deposition, thereby completing the electrode structure according to the present example. In the present example, the thicknesses of the compound layer 102 and the Pt layer 103 are prescribed at about 20 nm and about 100 nm, respectively.

The inventors fabricated electrode structures in accordance with the above-described process and measured the contact resistivity values thereof by a TLM (transmission line model) method. The measured contact resistivity values were in the range of about $1 \times 10^{-4}$ Ω cm$^2$ or less, which are smaller than that provided by a typical conventional electrode structure. Thus, in the case where the electrode having the highest resistivity value of $1 \times 10^{-4}$ Ω cm$^2$ (among the fabricated electrode structures) was employed as a p-side electrode for a semiconductor laser having a stripe width of about 10 μm and a cavity length of about 500 μm, for example, the voltage drop at the electrode when a current of 20 mA was applied thereto was minimized to about 400 mV, indicative of a very small influence on the total device voltage, which is on the order of several volts.

Figure 5:
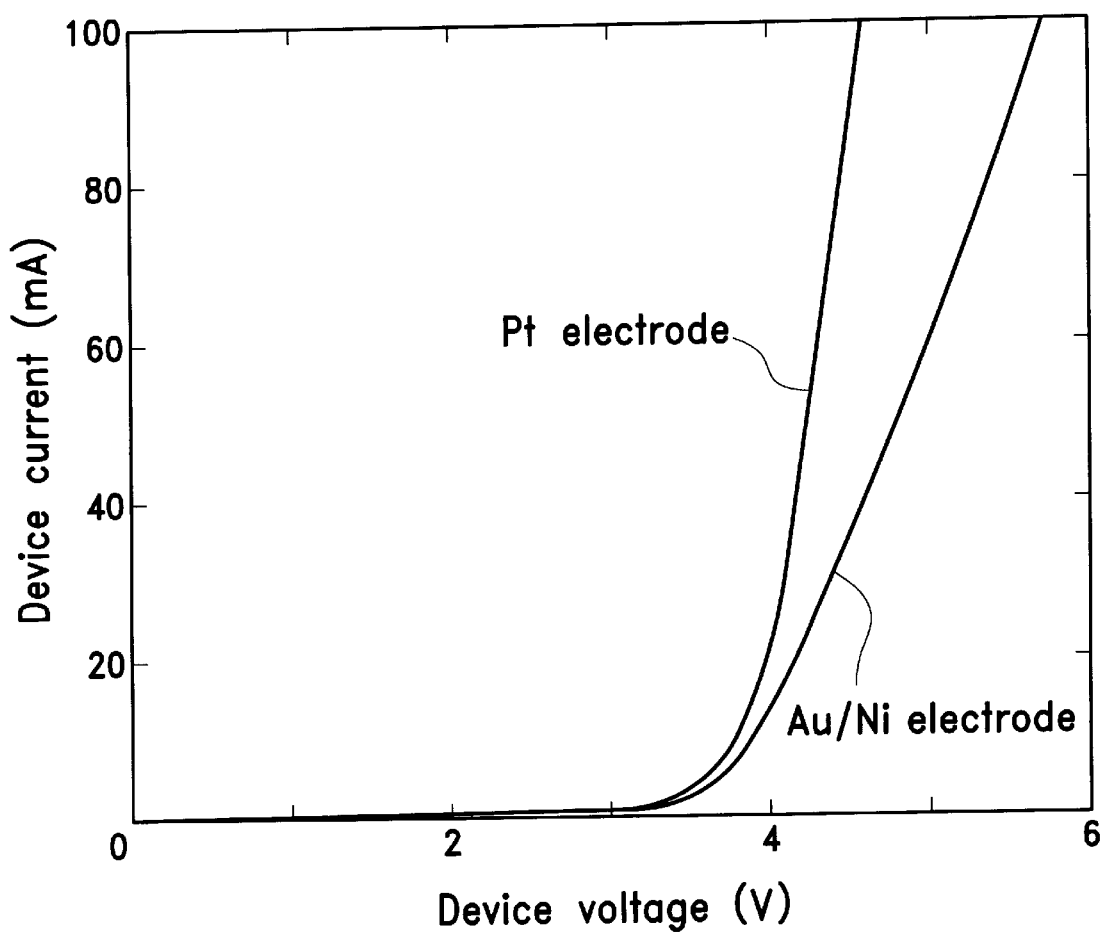
FIG. 5 is a graph illustrating the I–V characteristics of semiconductor LDs incorporating a Pt electrode and an Au/Ni electrode, respectively.

FIG. 5 is a graph illustrating the I–V characteristics of GaN group semiconductor LDs incorporating a Pt electrode as a p-side electrode and a conventional Au/Ni electrode, respectively. As seen from the graph, it was confirmed that the GaN group semiconductor LDs incorporating a Pt electrode as a p-side electrode has a lower resistivity than that of the GaN group semiconductor LD incorporating a conventional Au/Ni electrode as a p-side electrode, indicative of substantial improvement in the I–V characteristics.

The reason why the above-mentioned results are obtained is because, by ensuring that Pt atoms and Ga atoms are deposited directly on the GaN layer 101, a compound containing Ga and Pt can be produced with good controllability so that the molecular binding between Pt and N is minimized. Furthermore, in the above-described electrode structure, a high-resistance region is prevented from forming at the interface between the intermediate layer 102 and the p-GaN layer 101 due to N atoms being extracted from the GaN layer 101 during processes subsequent to the electrode formation.

Thus, in accordance with the electrode structure of the present invention, the broad and high energy barrier created at the interface between the p-GaN layer 101 and the Pt layer 103 is split so that the holes are less restrained by the barrier from passing through the interface, thereby reducing the contact resistivity of the electrode.

The composition of the Pt/Ga compound layer 102 formed in the above-described process is not limited to PtGa, but may also be a composition including Pt$_2$Ga$_3$ or Pt$_3$Ga$_2$, as long as it represents a compound of Ga and a metal element to be deposited on the compound layer.

In the electrodes actually fabricated according the present example, metal materials other than Pt, i.e., Ru, Rh, Pd, Os, Ir, and Ni were also tested as the metal material to be contained in the metal layer 103 and the compound layer 102, all of which instances provided a contact resistivity of about $1 \times 10^{-4}$ Ω cm$^2$ to about $5 \times 10^{-4}$ Ω cm$^2$.

The heating of the wafer during the aforementioned vapor deposition process is performed in order to enhance the affixation of the electrode and to enhance the compound-forming reaction between Pt and Ga. The wafer temperature is preferably kept at about 100° C. or more in order to ensure close contact between the compound layer 102 and the semiconductor layer 101, while it is also preferable to keep the wafer temperature at about 700° C. or less in order to minimize the dissociation of N off the surface of the GaN layer 101 in a vapor deposition chamber prior to the formation of the compound layer 102.

In the present example, a vapor deposition method of a resistance-heating type or an EB vapor deposition method is used for the formation of the films of the electrode structure. However, it is also applicable to use sputtering or CVD.

EXAMPLE 2

Since the electrode structure provided according to the present example is similar to that shown in FIG. 4, the same figure will be referred to in the description of the present example.

The Pt/Ga compound layer 102 in Example 1 was formed as a separate layer. In contrast, according to the present example, a Pt layer 103 is first deposited on a p-GaN layer 101 by EB vapor deposition, followed by an annealing process to form the electrode structure.

The annealing was conducted in a NF$_3$ atmosphere in order to prevent the dissociation of N from the GaN layer 101 and/or the oxidation of the electrode. The annealing was conducted at a temperature of about 750° C. for about 5 minutes. In this process, a compound layer having a thickness of about 5 nm and represented by the formula Pt$_x$Ga$_{1-x}$ (where x is between about 0.25 and 0.75) is formed between the p-GaN layer 101 and the Pt layer 103. The electrode thus formed had a contact resistivity of about $2 \times 10^{-4}$ Ω cm$^2$.

Furthermore, a study was conducted in accordance with the present example where the annealing temperature was varied by steps of about 50° C. between about 450° C. and about 1000° C. It was observed that a relatively high contact resistivity of about $2 \times 10^{-3}$ Ω cm$^2$ to $10 \times 10^{-3}$ Ω cm$^2$ resulted when the annealing was conducted at 450° C., 500° C., 550° C., 950° C., or 1000° C. One cause for such high contact resistivity values is the failure in forming the intermediate layer 102 below about 550° C. Another cause is that the wafers subjected to annealing above about 950° C. allowed the formation of the compound layer 102 to occur so rapidly that all the Pt atoms reacted into a compound and also allowed N atoms to be extracted from the GaN layer 101 into the atmosphere so that a high resistance layer formed.

Thus, with respect to a selected electrode metal, e.g., Pt, it is possible to form the compound layer 102 so that it contains substantially no nitrogen by performing annealing within an appropriate temperature range. Thus, it can be ensured that the compound layer 102 has a low resistance.

In order to securely form the compound layer 102 with good reproducibility, it is preferable that the annealing be performed for about 3 minutes or more. Moreover, in order to prevent the reaction of all the Pt atoms into a compound and the formation of a high resistance layer due to extraction of N atoms from the GaN layer 101 into the atmosphere, it is preferable that the annealing be performed for about 20 minutes or less. Thus, a p-side electrode structure providing a contact resistivity of about $5 \times 10^{-4}$ $\Omega$ cm$^2$ can be realized.

As described above, in the present example where annealing is conducted after the formation of a Pt layer for selectively forming a Pt/Ga compound, it was discovered that the most appropriate range of annealing temperatures was between about 600° C. and about 900° C., with most appropriate range of annealing time being between about 3 minutes to about 20 minutes.

In the electrode formed in accordance with the present example, metal materials other than Pt, i.e., Ru, Rh, Pd, Os, and Ir were also tested as the metal material to be contained in the compound layer 102, all of which instances provided a contact resistivity of about $1 \times 10^{-4}$ $\Omega$ cm$^2$ or less at annealing temperatures in the range of about 500° C. to about 900° C. (notwithstanding slight inter-material variations).

Among the above-listed metal species, Pd provided a contact resistivity of about $5 \times 10^{-4}$ $\Omega$ cm$^2$ or less with a particularly good controllability similar to that of Pt used in the above example.

EXAMPLE 3

Figure 6:
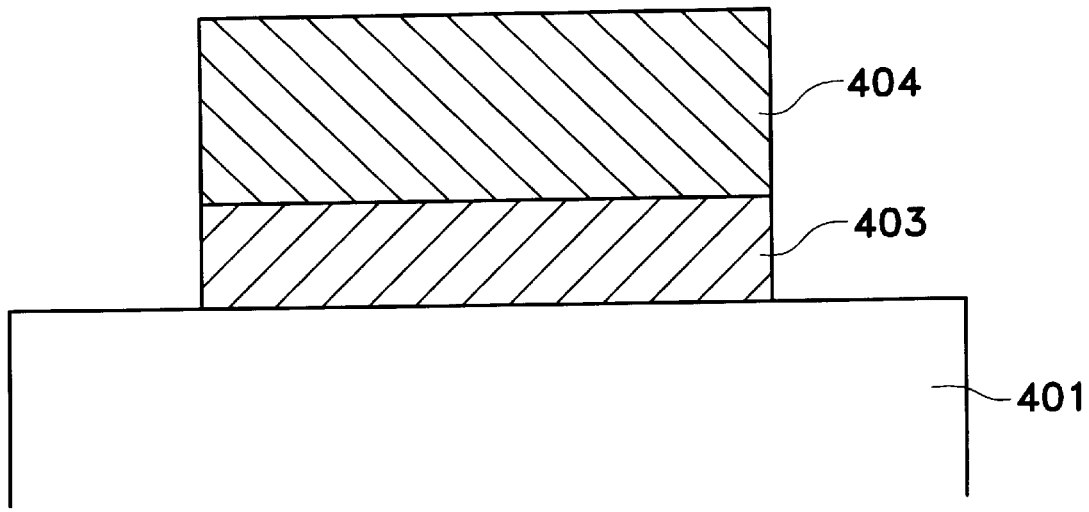
FIG. 6 is a schematic cross-sectional view showing an electrode structure according to Example 3 of the present invention immediately after the respective metal layers have been formed.
Figure 7:
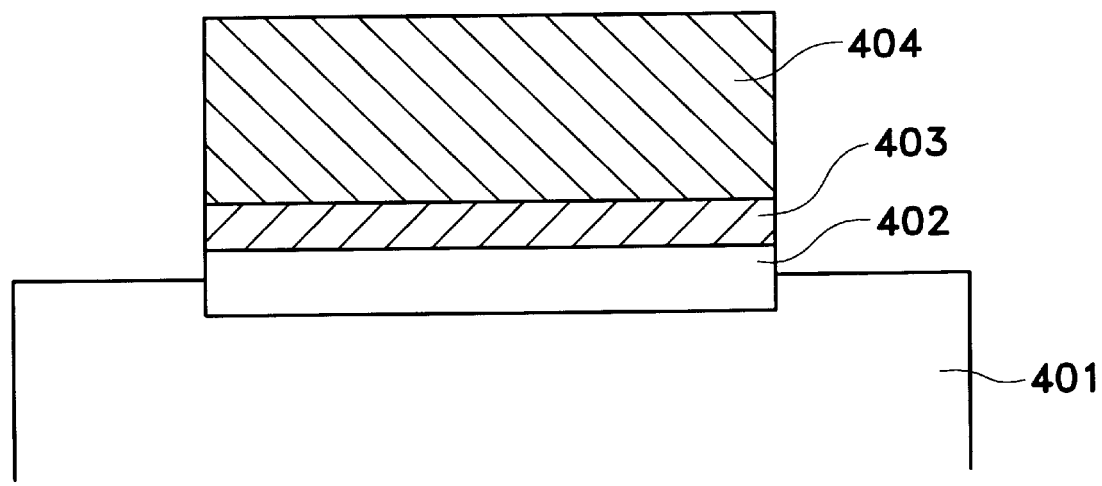
FIG. 7 is a schematic cross-sectional view showing an electrode structure according to Example 3 of the present invention after a thermal treatment is conducted.

Next, an exemplary manufacturing process of an electrode structure incorporating a Pd metal layer formed upon a p-GaN layer will be described with reference to FIGS. 6 and 7.

First, a p-GaN layer 401 is epitaxially grown on an SiC substrate by an MBE (molecular beam epitaxy) method, with about $10^{20}$ cm$^{-3}$ of Zn added thereto for providing a carrier density of about $7 \times 10^{17}$ cm$^{-3}$. The surface of the p-GaN layer 401 is subjected to ultrasonic wave washing in acetone and ethanol, thereby removing the contamination (i.e., oils or organic dusts) present thereon. After the wafer is placed in an RIE (reactive ion etching) apparatus, a plasma irradiation (with a 200 W power) is performed on the surface of the p-GaN layer 401 for about 30 seconds by using chlorine type gases such as $Cl_2$ or $BCl_3$. Thus, the oxide adsorbed onto the surface of the p-GaN layer 401 as well as the oxide layer and other impurity layers formed thereon are removed.

After cleansing the surface of the p-GaN layer 401 as described above, the wafer is set in a main chamber of an RF sputtering apparatus, and the air within the chamber is expelled to achieve a high vacuum level (about $1 \times 10^{-6}$ Torr to about $2 \times 10^{-6}$ Torr or less). After a predetermined vacuum level is achieved, the wafer is heated to about 200° C., and an electrode metal layer 403 of Pd (thickness: about 100 nm) and a bonding electrode 404 (thickness: about 200 nm) are formed by sputtering using an Ar plasma, thereby resulting in the multilayer structure shown in FIG. 6.

Thereafter, the electrode structure is subjected to annealing at about 650° C. in a $N_2$ atmosphere for about minutes, whereby a compound-forming reaction takes place at the interface between the p-GaN layer 401 and the Pd layer 403 so as to form a Pd/Ga compound layer 402 (thickness: about 10 nm). Thus, the electrode structure shown in FIG. 7 is obtained.

The composition of the Pd/Ga compound layer 402 formed in the above-described process is not limited to PdGa, but may also be a composition including $Pd_2Ga_3$ or $Pd_3Ga_2$, as long as it represents a compound of Ga and a metal element present immediately above the compound layer 402. The heating of the wafer during the aforementioned vacuum vapor deposition process is performed in order to enhance the affixation of the respective metal layers, and therefore is not limited to being conducted at a temperature of 200° C.

The inventors measured the contact resistivity values of the electrode structures fabricated in accordance with the above-described process by a TLM method. The measured contact resistivity values were in the range of about $3 \times 10^{-4}$ $\Omega$ cm$^2$ or less, which are still smaller than that provided by a typical conventional electrode structure, although not as small as that provided by Example 1 of the present invention. Thus, the formation of the intermediate layer (i.e., the compound layer 402) prevents the formation of a high resistance region at the interface between the Pd layer 403 and the p-GaN layer 401 during processes after the electrode formation. As in the case of employing the aforementioned Pt/Ga compound, according to the present example, the N atoms within the crystal of the p-GaN layer 401 are prevented from being extracted to form a high resistance layer or an n-type layer on the surface of the underlying p-GaN layer 401.

Furthermore, a study was conducted in accordance with the present example where the annealing temperature was varied by steps of about 50° C. between about 450° C. and about 1000° C. It was observed that a relatively high contact resistivity of about $5 \times 10^{-3}$ $\Omega$ cm$^2$ to $10 \times 10^{-3}$ $\Omega$ cm$^2$ resulted when the annealing was conducted at a temperature below about 450° C. or a temperature above about 850° C. One cause for such high contact resistivity values is the failure in forming the intermediate layer 402 below about 450° C. Another cause is that the wafers subjected to annealing above about 850° C. allowed the formation of the compound layer 402 to occur so rapidly that all the Pd atoms reacted into a compound and also allowed N atoms to be extracted from the GaN layer 401 into the atmosphere so that a high resistance layer formed. Moreover, a problem was discovered in that the Au layer 404 reaches the GaN layer 401 at such high temperatures, thereby increasing the energy barrier at the interface and making for higher resistance.

In order to securely form the compound layer 402 with good reproducibility, it is preferable that the annealing be performed for about 3 minutes or more. Moreover, in order to prevent the reaction of all the Pd atoms into a compound and the formation of a high resistance layer due to extraction of N atoms from the GaN layer 401 into the atmosphere, it is preferable that the annealing be performed for about 20 minutes or less. Thus, a p-side electrode structure providing a contact resistivity of about $5 \times 10^{-3}$ $\Omega$ cm$^2$ can be realized.

As described above, in the present example where annealing is conducted after the formation of the Pd layer 403 for selectively forming a Pd/Ga intermediate (compound) layer 402, it was discovered that the most appropriate range of annealing temperatures was between about 500° C. and about 800° C., with most appropriate range of annealing time being between about 3 minutes to about 20 minutes.

Other metal species capable of minimizing the extraction of N atoms from the GaN layer 401 and selectively forming a compound intermediate layer (compound layer) 402 with Ga include Ru, Rh, Os, and Ir. In such cases, too, an electrode structure is realized that includes a metal layer, a metal/Ga compound layer, and a GaN group semiconductor layer. Herein, a p-side electrode having a contact resistivity of about $5 \times 10^{-4}$ $\Omega$ cm$^2$ or less can be achieved by employing a structure including a metal-Ga compound layer containing substantially no nitrogen, namely, a structure including a metal layer, a metal/Ga compound layer, and a GaN group semiconductor layer. In the case where the above-listed metal species are employed as the electrode metal material, in general, the annealing temperature is preferably about 500° C. to about 900° C., as in the case of employing Pt or Pd.

Although RF sputtering is employed for the formation of the respective films in the electrode structure according to the present example, it is also applicable to employ EB vapor deposition, as in Example 1, or any other thin-film formation method; the present invention provides no limitation as to the type of film formation method.

A p-type dopant (e.g., Mg or Zn) may be diffused in the surface of the p-GaN layer in Examples 1 to 3 so as to increase the carrier density in the vicinity of the surface of the p-GaN layer. This will make it possible to provide electrode structures having even lower contact resistivity values can be obtained than those provided by the electrode structures according to Examples 1 to 3, as will be appreciated by those skilled in the art.

According to the present invention, a compound of a metal element and Ga can be selectively formed in an electrode structure based on p-GaN, thereby minimizing the chances of allowing the formation of a high resistance layer of an n-type layer on the surface of the GaN layer. As a result, an ohmic electrode having a low contact resistivity of about $5 \times 10^{-4}$ $\Omega$ cm$^2$ or less can be provided. Thus, it is possible according to the present invention to greatly lower the operation voltage of a light emission device such as a semiconductor laser or an LED.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A GaN group compound semiconductor device comprising an electrode structure provided on a p-GaN group compound semiconductor layer, the electrode structure including:

a first layer formed on the p-GaN group compound semiconductor layer, the first layer comprising a compound including a first metal element and Ga; and a second layer formed on the first layer, the second layer comprising the first metal element, wherein the first layer contains substantially no nitrogen, and wherein the first metal element includes at least one element of the group consisting of Ru, Rh, Pd, Os, Ir, Pt, and Ni, or a compound including at least two elements of the group.

2. A GaN group compound semiconductor device according to claim 1, wherein the electrode structure has a contact resistivity of about $5 \times 10^{-4}$ $\Omega$ cm$^2$ or lower.

3. A method for producing a GaN group compound semiconductor device comprising an electrode structure provided on a p-GaN group compound semiconductor layer, the method comprising forming the electrode structure including the steps of:

forming a first layer on the p-GaN group compound semiconductor layer, the first layer comprising a compound including a first metal element and Ga; and forming a second layer on the first layer, the second layer comprising the first metal element, wherein the first metal element includes at least one element of the group consisting of Ru, Rh, Pd, Os, Ir, Pt, and Ni, or a compound including at least two elements of the group.

4. A method for producing a GaN group compound semiconductor device according to claim 3, wherein at least one of the step of forming the first layer and the step of forming the second layer employs a method selected from a group including: a vacuum vapor deposition method, a chemical vapor deposition method, and a radiofrequency sputtering method.

5. A method for producing a GaN group compound semiconductor device according to claim 3, wherein the first layer contains substantially no nitrogen.

6. A method for producing a GaN group compound semiconductor device comprising an electrode structure provided on a p-GaN group compound semiconductor layer, the method comprising forming the electrode structure including the steps of:

forming a second layer on the p-GaN group compound semiconductor layer, the second layer comprising a first metal element; and performing an annealing to form a first layer between the p-GaN group compound semiconductor layer and the second layer, the first layer comprising a compound including the first metal element and Ga, wherein the first metal element includes at least one element of the group consisting of Ru, Rh, Pd, Os, Ir, and Pt.

7. A method for producing a GaN group compound semiconductor device according to claim 6, wherein the step of performing an annealing is conducted at a temperature in a range between about 500° C. and about 900° C.

8. A method for producing a GaN group compound semiconductor device according to claim 6, wherein the first metal is Pd and the step of performing an annealing is conducted at a temperature in a range between about 500° C. and about 800° C.

9. A method for producing a GaN group compound semiconductor device according to claim 6, wherein the first metal is Pt and the step of performing an annealing is conducted at a temperature in a range between about 600° C. and about 900° C.

10. A method for producing a GaN group compound semiconductor device according to claim 6, wherein the first layer contains substantially no nitrogen.

11. A GaN group compound semiconductor device comprising an electrode structure provided on a p-GaN group compound semiconductor layer, the electrode structure including:

a first layer formed on the p-GaN group compound semiconductor layer, the first layer comprising a compound including a first metal element and Ga; and a second layer formed on the first layer, the second layer comprising the first metal element, wherein the first layer contains substantially no nitrogen, and the electrode structure has a contact resistivity of about $5 \times 10^{-4}$ $\Omega$ cm$^2$ or lower.

12. A GaN group compound semiconductor device comprising an electrode structure provided on a p-GaN group compound semiconductor layer, the electrode structure including:

a first layer formed on the p-GaN group compound semiconductor layer, the first layer comprising a compound including a first metal element and Ga; and a second layer formed on the first layer, the second layer comprising the first metal element, wherein the first layer contains substantially no nitrogen, and the first metal element is capable of forming a Ga compound.

13. A GaN group compound semiconductor device according to claim 12, wherein the first metal element includes at least one element of the group consisting of Ru, Rh, Pd, Os, Ir, Pt, and Ni, or a compound including at least two elements of the group.

* * * * *